(12) United States Patent
Yi et al.

(10) Patent No.: US 7,652,312 B2
(45) Date of Patent: Jan. 26, 2010

(54) CMOS IMAGE SENSOR

(75) Inventors: Duk-Min Yi, Yongin-si (KR);
Jong-Chae Kim, Yongin-si (KR);
Jin-Hyeong Park, Seoul (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 21 days.

(21) Appl. No.: 12/062,552

(22) Filed: Apr. 4, 2008

(65) Prior Publication Data

US 2008/0185621 A1    Aug. 7, 2008

Related U.S. Application Data

(62) Division of application No. 11/284,883, filed on Nov. 23, 2005, now Pat. No. 7,378,694.

(30) Foreign Application Priority Data

Nov. 25, 2004   (KR)  ............................ 2004-97418

(51) Int. Cl.
*H01L 31/062*    (2006.01)

(52) U.S. Cl. .................... 257/291; 257/292; 257/239; 257/E27.133

(58) Field of Classification Search ................. 257/291, 257/292, 239, E27.133
See application file for complete search history.

(56) References Cited

U.S. PATENT DOCUMENTS

| 7,378,694 B2 * | 5/2008 | Yi et al. ...................... 257/291 |
| 2006/0011952 A1 | 1/2006 | Ohkawa |

FOREIGN PATENT DOCUMENTS

| JP | 08-335688 | 12/1996 |
| JP | 2003-333431 | 11/2003 |
| KR | 1020030008481 A | 12/1996 |
| KR | 1020010057856 A | 7/2001 |
| KR | 1020010086511 A | 9/2001 |
| KR | 1020030084489 A | 11/2003 |
| KR | 1020040038225 A1 | 5/2004 |
| KR | 1020040093997 A | 11/2004 |

* cited by examiner

*Primary Examiner*—Minh-Loan T Tran
(74) *Attorney, Agent, or Firm*—Volentine & Whitt, PLLC

(57) ABSTRACT

A complementary metal-oxide semiconductor (CMOS) image sensor comprises a photodiode region generating electrical charges in response to incident light thereon. The CMOS image sensor further comprises a first floating diffusion layer adapted to receive the electrical charges from the photodiode region in response to a global transfer signal and a second floating diffusion region adapted to receive the electrical charges from the first floating diffusion region in response to a pixel selection signal.

8 Claims, 5 Drawing Sheets

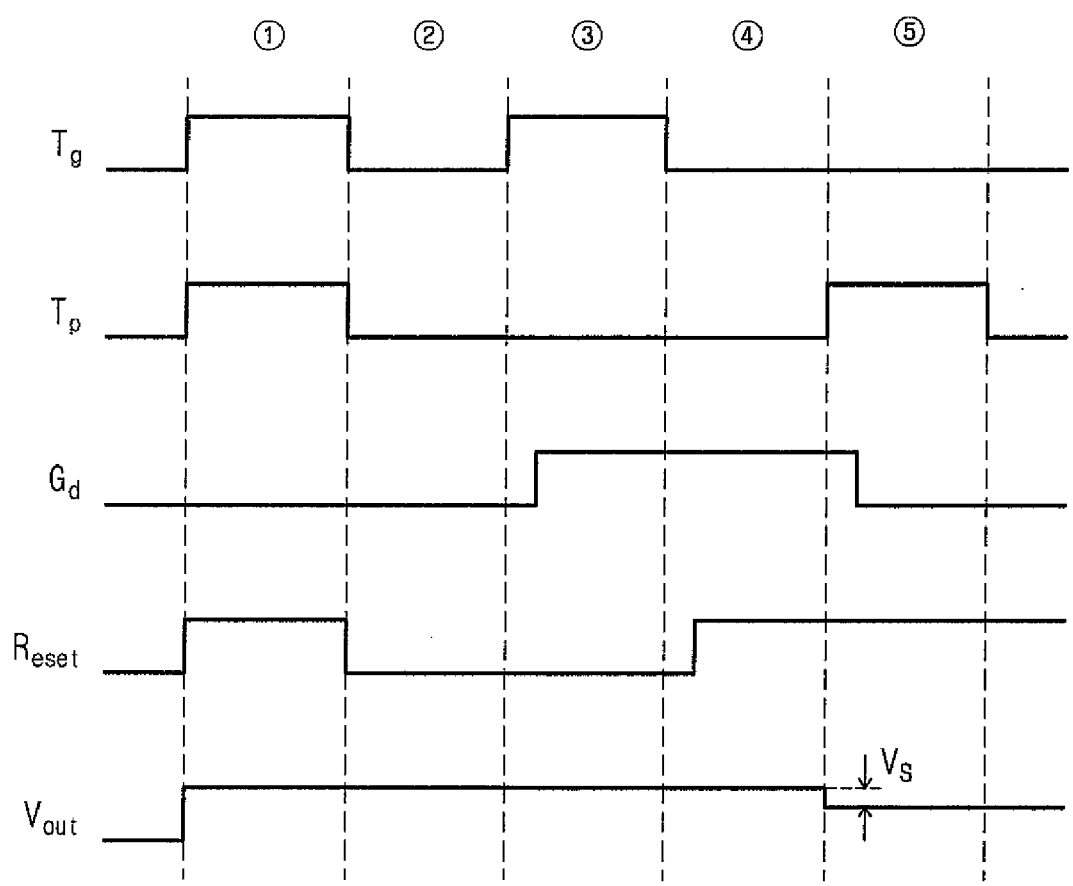

CMOS IMAGE SENSOR

CROSS-REFERENCE TO RELATED APPLICATIONS

This is a divisional of application Ser. No. 11/284,883, filed Nov. 23, 2005, which is incorporated herein by reference in its entirety.

BACKGROUND OF THE INVENTION

1. Field of the Invention

The invention relates generally to a complementary metal-oxide semiconductor (CMOS) image sensor. More particularly, the invention relates to a CMOS image sensor having a Single Frame Capture Mode (SFCM).

A claim of priority is made to Korean Patent Applications No. 2004-97418, filed on Nov. 25, 2004, the disclosure of which is hereby incorporated by reference in its entirety.

2. Description of the Related Art

A wide array of consumer and industrial electronic devices incorporate image sensors. These devices include, for example, digital cameras, cellular phones, web cameras, personal digital assistants, and digital video cameras, to name but a few.

The two most popular types of image sensors used in contemporary electronic devices are charge coupled device (CCD) image sensors and complementary metal-oxide semiconductor (CMOS) image sensors. Historically, CCD image sensors have been more popular than CMOS image sensors. However, due to improvements in the CMOS image sensors, an increasing number of devices are incorporating these types of image sensors.

CMOS image sensors currently offer a number of benefits relative to CCD image sensors. For example, CMOS image sensors typically consume less power than CCD image sensors and they also allow other circuit functions such as drivers, clocks, amplifiers, etc., to be included on the same integrated circuit (IC) chip with the CMOS image sensors. In addition, CMOS image sensors can be more highly integrated than CCD image sensors, i.e., a CMOS image sensor can be significantly smaller than a CCD image sensor, and furthermore, unlike CCD image sensors, CMOS image sensors can be manufactured using standard CMOS manufacturing, e.g., equipment used to manufacture processors, memories, and so forth.

Unfortunately, CMOS image sensors still tend to have more noise (e.g., dark current) than CCD image sensors. A part of this noise is caused by on chip circuitry in the CMOS image sensors. Another part of the noise is caused by surface contamination and physical stress introduced by fabrication processes into a floating diffusion layer where electrical charges are accumulated during operation of the CMOS image sensors.

Another problem with CMOS image sensors is that the response of different pixels in the CMOS image sensors under identical lighting conditions tends to be slightly less uniform than that of CCD image sensors. One reason for the lack of uniform pixel response in CMOS image sensors is that pixels in CMOS image sensors are typically "read out" in a sequence, e.g., line by line, allowing some pixels to be exposed for a longer time than others. The non-uniform exposure time not only leads to non-uniform images, but in some cases it may even cause some pixels to become "over-exposed", spilling over charges into adjacent pixels.

Although CCD image sensors also read out pixels in a sequence, CCD image sensors address the problem of non-uniform exposure by capturing images using a "single frame capture mode". In the single frame capture mode, the CCD image sensor captures a single frame (i.e., an image) by simultaneously converting incident light at all pixels in the CCD image sensor into electrical charges and then converting the electrical charges into voltages representing the image. The simultaneous conversion of incident light into electrical charges may be accomplished, for example, using electronic shuttering.

Unfortunately, conventional CMOS image sensors do not provide a single frame capture mode, as illustrated by the following example shown in FIG. 1.

FIG. 1 is a circuit diagram illustrating a conventional CMOS image sensor. In particular, FIG. 1 shows a pixel sensor in a conventional CMOS image sensor.

Referring to FIG. 1, a pixel sensor of a conventional 4-transistor CMOS image sensor comprises a photodiode region 10 generating electrical charges in response to incident light, and a transfer transistor 12 connected between photodiode region 10 and a floating diffusion layer (or node) 14 and gated by a column selection signal. Transfer transistor 12 transfers electrical charges accumulated in photodiode region 10 to floating diffusion layer 14 in response to the column selection signal.

The pixel sensor further comprises a source follower transistor 20 having a gate connected to node 14 and a source connected to a data output terminal Vout. The voltage of data output terminal Vout varies based on the amount of electrical charges transferred to floating diffusion layer 14.

The pixel sensor still further comprises a reset transistor 16 connected between floating diffusion layer 14 and a power supply voltage VDD. The potential of floating diffusion layer 14 is reset through reset transistor 16.

The pixel sensor still further comprises a column selection transistor 18 connected between the drain of source follower transistor 20 and power supply voltage VDD and gated by the column selection signal. Column selection transistor 18 provides power supply voltage VDD to the drain of source follower transistor 20 in response to the column selection signal.

Where transfer transistor 12 is turned on by the column selection signal, electrical charges accumulated in photodiode region 10 are transferred to floating diffusion layer 14. The gate voltage of source follower transistor 20 varies according to the amount of electrical charges accumulated at floating diffusion layer 14. A voltage of data output terminal Vout caused by the variation of the gate voltage of the source follower transistor 20 is sensed.

The conventional pixel sensor illustrated in FIG. 1 has a contact structure formed on floating diffusion layer 14 to electrically connect the gate of source follower transistor 20 to floating diffusion layer 14. Dark current and noise frequently occur in the pixel sensor due to surface contamination and stress on the floating diffusion layer.

In addition, a 4-transistor pixel sensor is not designed to operate in a single frame capture mode (SFCM). In order to operate in SFCM, all pixel sensors in an image sensor need to simultaneously sense incident light and transfer resulting electrical charges. However, conventional CMOS image sensors using the 4-transistor pixel sensor illustrated in FIG. 1 can not operate in SFCM because transfer transistors 12 in different respective pixel sensors are turned on in sequence. Furthermore, because there is a time delay between when electrical charges stored at each floating diffusion region 14 are output to data output terminal Vout, dark current and noise are produced at floating diffusion layer 14. Accordingly, image quality is degraded.

SUMMARY OF THE INVENTION

According to one embodiment of the present invention, an image sensor is provided. The image sensor comprises a plurality of pixel sensors, wherein each pixel sensor comprises a photodiode region adapted to generate electrical charges in response to incident light thereon, a global transfer transistor connected between the photodiode region and a first floating diffusion layer and having a gate adapted to receive a global transfer signal, a pixel transfer transistor connected between the first floating diffusion layer and a second floating diffusion layer and having a gate adapted to receive a pixel selection signal, and a reset transistor connected between a power supply and the second floating diffusion layer and having a gate adapted to receive a reset signal.

Each pixel sensor in the image sensor typically further comprises a source follower transistor connected between a data output node and the power supply and having a gate connected to the second floating diffusion layer. In addition, the image sensor typically comprises a retention gate formed on an upper portion of the first floating diffusion layer.

According to another embodiment of the invention, another image sensor is provided. The image sensor comprises a plurality of pixel sensors, wherein each pixel sensor comprises a photodiode region adapted to generate electrical charges in response to incident light thereon, a global transfer transistor connected between the photodiode region and a first floating diffusion layer and having a gate adapted to receive a global transfer signal, a pixel transfer transistor connected between the first floating diffusion region and a second floating diffusion region and having a gate adapted to receive a pixel selection signal, a reset transistor connected between a power supply and the second floating diffusion layer and having a gate adapted to receive a reset signal, and a source follower transistor connected between the power supply and a data output terminal and having a gate connected to the second floating diffusion layer.

Each pixel sensor in the image sensor typically further comprises a retention gate formed on an upper portion of the first floating diffusion layer.

According to still another embodiment of the present invention, another image sensor is provided. The image sensor comprises a plurality of pixel sensors, wherein each of pixel sensor comprises a photodiode region adapted to generate generating a electrical charges in response to incident light thereon, a global transfer transistor connected between the photodiode region and a first floating diffusion layer and having a gate adapted to receive a global transfer signal, a pixel transfer transistor connected between the first floating diffusion region and a second floating diffusion region and having a gate adapted to receive a pixel selection signal, a reset transistor connected between a power supply and the photodiode region and having a gate adapted to receive a reset signal, and a source follower transistor connected between the power supply and a data output terminal and having a gate connected to the second floating diffusion layer.

Each pixel sensor in the image sensor typically further comprises a retention gate formed on an upper portion of the first floating diffusion layer.

BRIEF DESCRIPTION OF THE DRAWINGS

The invention is described below in relation to several embodiments illustrated in the accompanying drawings. Throughout the drawings like reference numbers indicate like exemplary elements, components, or steps. In addition, the thickness of layers in the drawings has been exaggerated for clarity. In the drawings.

DESCRIPTION OF THE EXEMPLARY EMBODIMENTS

Exemplary embodiments of the invention are described below with reference to the corresponding drawings. These embodiments are presented as teaching examples. The actual scope of the invention is defined by the claims that follow.

Figure 2A:
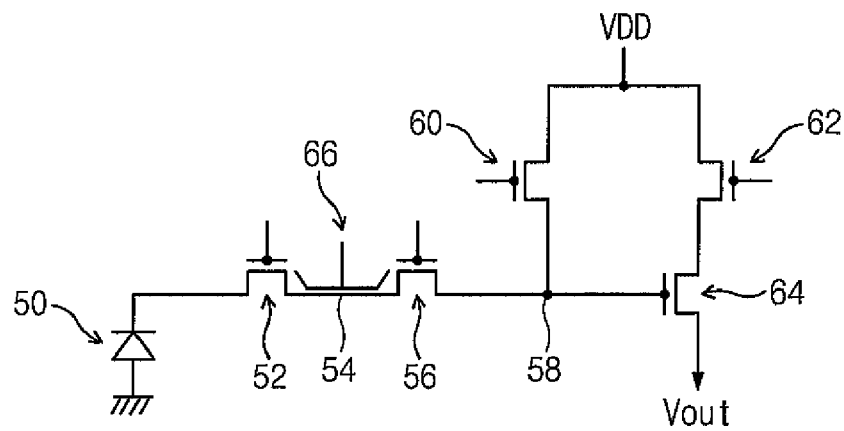
FIG. 2A is a circuit diagram of a CMOS image sensor according to one embodiment of the present invention.

FIG. 2A is a circuit diagram of a CMOS image sensor according to one embodiment of the present invention.

Referring to FIG. 2A, a pixel sensor in the CMOS image sensor comprises a photodiode region 50 generating electrical charges in response to incident light, a first floating diffusion layer 54, and a second floating diffusion layer 58. A global transfer transistor 52 connects first floating diffusion layer 54 to photodiode region 50 and a pixel transfer transistor 56 connects first floating diffusion layer 54 to second floating diffusion layer 58. A source follower transistor 64 has a source connected to a data output terminal Vout and a gate connected to second floating diffusion layer 58.

Global transfer transistor 52 transfers the electrical charges generated by photodiode region 50 to first floating diffusion layer 54. Pixel transfer transistor 56 transfers electrical charges accumulated at first floating diffusion layer 54 to second floating diffusion layer 58. Source follower transistor 64 changes a voltage level of a data output terminal Vout according to the amount of electrical charges accumulated in second floating diffusion layer 58.

A reset transistor 60 is connected between a power supply providing a power supply voltage VDD and second floating diffusion layer 58 and a column selection transistor 62 is connected between the power supply and a drain of source follower transistor 64. Reset transistor 60 resets the amount of electrical charges accumulated at second floating diffusion layer 58 and column selection transistor 62 provides power supply voltage VDD to source follower transistor 64 according to a column selection signal received at a gate thereof.

In a CMOS image sensor using the pixel sensor shown in FIG. 2, electrical charges at all photodiode regions of a pixel array are transferred to respective first floating diffusion layers 54 and then stored until each respective pixel is selected. Respective global transfer transistors 52 are simultaneously turned on by a global transfer signal received at their respective gates, and therefore, electrical charges are simultaneously transferred from the photodiode regions in the pixel array to their corresponding first floating diffusion layers 54.

Pixel transfer transistors 56 in the pixel array are turned on by a pixel selection signal applied to their respective gates to transfer electrical charges accumulated in respective first floating diffusion layers 54 to corresponding second floating diffusion layers 58. Second floating diffusion layer 58 performs the same function as the floating diffusion layer in the conventional 4-transistor pixel illustrated in FIG. 1. In other words, a gate voltage of source follower transistor 64 varies according to the amount of electrical charges accumulated at second floating diffusion layer 58. As a result, a voltage level of data output terminal Vout tends to change according to changes in the gate voltage of source follower diffusion layer 58.

The pixel sensor shown in FIG. 2 further includes a retention gate 66 formed on first floating diffusion layer 54. Retention gate 66 is formed on first floating diffusion layer 54 to protect first floating diffusion layer 54 and to improve functions of the pixel sensor such as transferring electrical charges to and from floating diffusion layer 54 and maintaining electrical charges at floating diffusion layer 54.

When transferring electrical charges from photodiode region 50 to first floating diffusion layer 54, retention gate 66 is charged to ground or to a voltage with an opposite polarity of the electrical charges so as to reduce the electrical potential of first floating diffusion layer 54. When transferring electrical charges from first floating diffusion layer 54 to second floating diffusion layer 58, retention gate 66 is charged to a voltage with the same polarity as the electrical charges so as to increase the electrical potential of first floating diffusion layer 54. During a period where the electrical charges are accumulated in first floating diffusion layer 54 and waiting to be transferred to second floating diffusion layer 54, the maintenance of electrical charges can be improved by applying a voltage with an opposite polarity of the electrical charges to retention gate 66.

Figure 1:
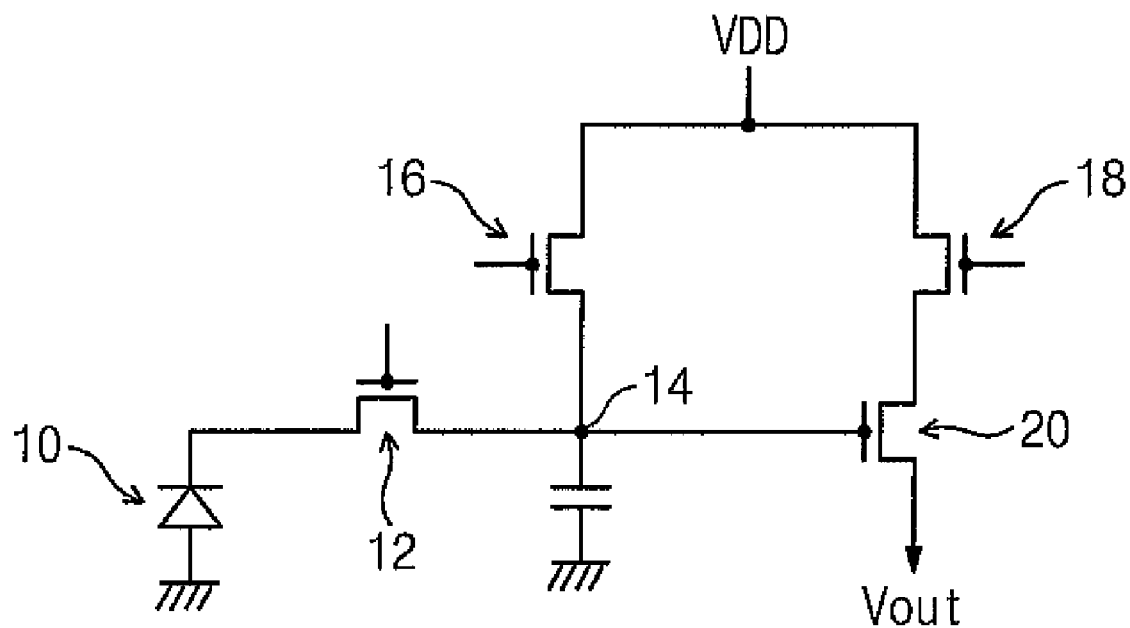
FIG. 1 is a circuit diagram of a conventional CMOS image sensor.

Reset transistor 60 is connected to second floating diffusion layer 58 as in the conventional 4-transistor pixel illustrated in FIG. 1. A reset signal is applied to the gate of reset transistor 60 to reset the voltage levels of first and second floating diffusion layers 54 and 58. The reset signal is generally applied to the gate of reset transistor after data has been transferred from the pixel sensor to data output terminal Vout. At the same time, global transfer transistor 52 and pixel transfer transistor 56 are turned on so that the voltage levels of first and second floating diffusion layers 54 and 58 is reset to power supply voltage VDD.

Figure 2B:
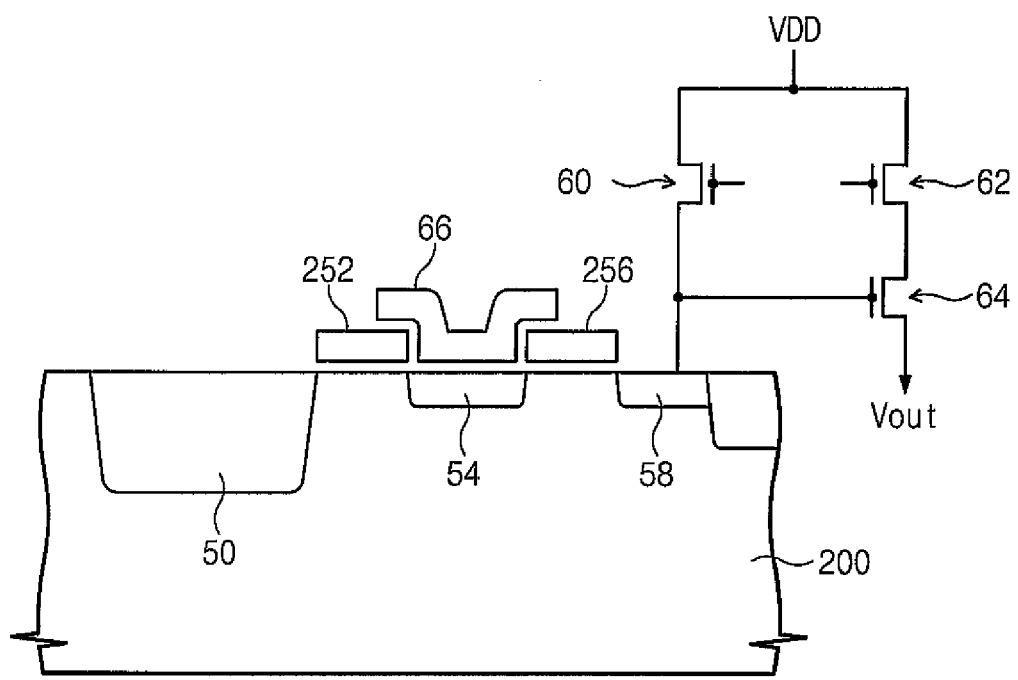
FIG. 2B is a diagram showing a cross-sectional view of part of the CMOS image sensor in FIG. 2A.

FIG. 2B is a diagram showing a cross-sectional view of part of the pixel sensor shown in FIG. 2A.

Referring to FIG. 2B, photodiode region 50, first floating diffusion region 54, and second floating diffusion region 58 are formed in a semiconductor substrate 200. Global transfer transistor 52 is formed between photodiode region 50 and first floating diffusion region 54, and pixel transfer transistor 56 is formed between first floating diffusion region 54 and second floating diffusion region 58.

A gate electrode 252 of global transfer transistor 52 is formed between photodiode region 50 and first floating diffusion layer 54. Gate electrode 252 defines a channel region of global transfer transistor 52.

A gate electrode 256 of pixel transfer transistor 56 is formed between first floating diffusion region 54 and second floating diffusion region 58. Gate electrode 256 defines a channel of pixel transfer transistor 56.

Retention gate 66 is formed on first floating diffusion layer 54. Retention gate 66 covers an upper portion of first floating diffusion layer 54 to prevent first floating diffusion layer 54 from being damaged by manufacturing processes and to prevent incident light from being received by first floating diffusion layer 54.

Pixel transfer transistor 56 is turned on by a pixel selection signal to transfer electrical charges accumulated at first floating diffusion layer 54 to second floating diffusion layer 58. Retention gate 66 is electrically insulated by gates formed at sides thereof.

Figure 2C:
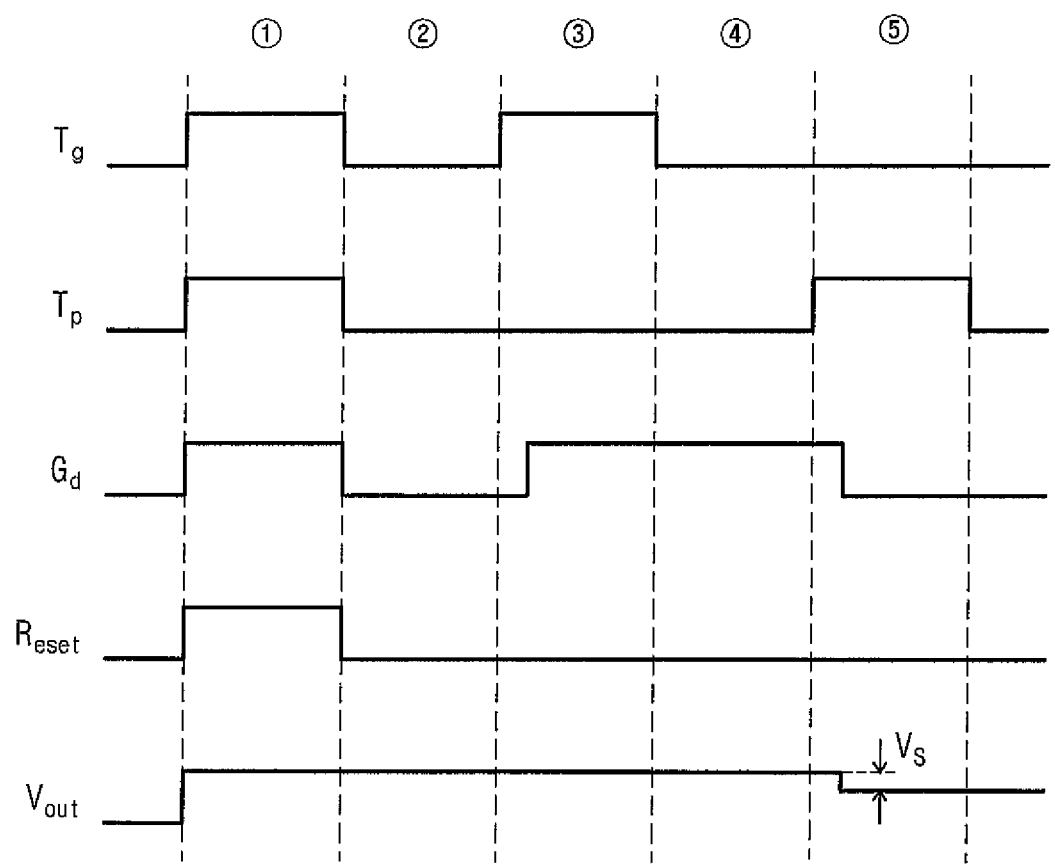
FIG. 2C is a timing diagram illustrating the operation of the CMOS image sensor shown in FIG. 2A.

FIG. 2C is a timing diagram illustrating the operation of the CMOS image sensor shown in FIG. 2A.

Referring to FIG. 2C, in a reset step (□), a global transfer signal Tg is input to global transfer transistor 52 with a logic level "high", a pixel selection signal Tp is input to pixel transfer transistor 56 with logic level "high", a signal Gd is input to retention gate 66 with logic level "high", and a reset signal Reset is input to reset transistor 60 with logic level "high". At this time, data output terminal Vout outputs a signal Vout with a reference voltage level.

In an image sensing step (□), the signals Tg, Tp, Gd, and Reset all assume a logic level "low". This causes electrical charges generated by incident light in photodiode region 50 to accumulate.

In a frame capture step (□), global transfer signal Tg assumes logic level "high" to cause electrical charges accumulated in photodiode region 50 to be transferred to first floating diffusion layer 54, where they are temporarily stored. While the electrical charges are transferred to first floating diffusion layer 54' signal Gd assumes logic level "high" to retain the electrical charges at first floating diffusion layer 54.

In a pixel selection waiting step (□), global transfer signal Tg assumes logic level "low" to turn off global transfer transistor 52, and signal Gd is maintained at logic level "high" to maintain the electrical charges.

In a data output step (□), pixel selection signal Tp assumes logic level "high" so that pixel transfer transistor 56 transfers the electrical charges stored at first floating diffusion layer to second floating diffusion layer 58. In this case, the transfer of the electrical charges is aided by switching signal Gd at retention gate 66 to logic level "low". The voltage level of data output terminal Vout varies according to the amount of electrical charges accumulated at second floating diffusion layer 58. An image signal is determined by a difference Vs between the reference voltage level of signal Vout and the level of signal Vout after signal Gd switches to logic level "low".

Figure 3A:
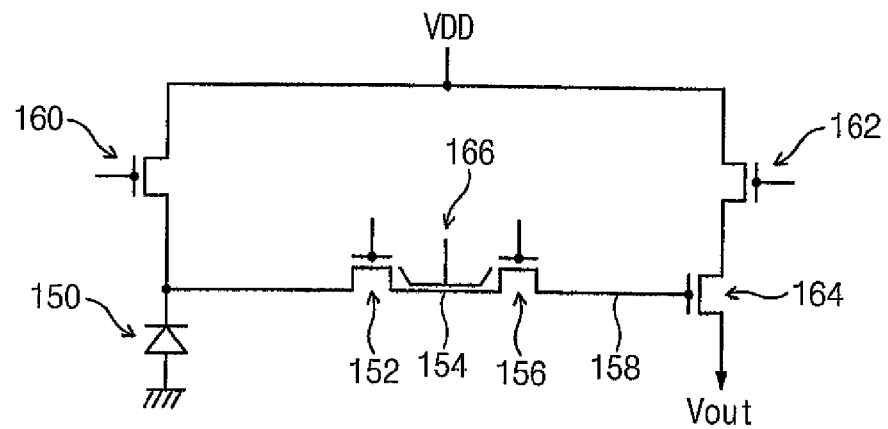
FIG. 3A is a circuit diagram of a CMOS image sensor according to another embodiment of the present invention.

FIG. 3A is a circuit diagram showing a CMOS image sensor according to another embodiment of the present invention.

Referring to FIG. 3A, a pixel sensor of the CMOS image sensor comprises a photodiode region 150, a first floating diffusion layer 154, and a second floating diffusion layer 158. Photodiode region 150 generates a electrical charges in response to incident light and the electrical charges are subsequently transferred to first and second floating layers 154 and 158.

The pixel sensor further comprises a global transfer transistor 152, a pixel transfer transistor 156, and a source follower transistor 164. Global transfer transistor 152 transfers the electrical charges accumulated at photodiode region 150 to first floating diffusion layer 154. Pixel transfer transistor 156 then transfers the electrical charges accumulated at first floating diffusion layer 154 to second floating diffusion layer 158. Source follower transistor 164 changes a level of voltage at a data output terminal Vout according to the amount of electrical charges accumulated at second floating diffusion layer 158.

The pixel sensor further comprises a reset transistor 160 and a column selection transistor 162. Reset transistor 160 is connected between a power supply providing a power supply voltage VDD and photodiode region 150, and column selection transistor is connected between the power supply and a drain of source follower transistor 164. Reset transistor 160 resets an amount of electrical charges accumulated at second floating diffusion layer 158, and column selection transistor 162 supplies power supply voltage to VDD to source follower transistor 164 in response to a column selection signal received at the gate thereof.

In an image sensor using the pixel sensor shown in FIG. 3A, electrical charges in respective photodiode regions 150 of a pixel sensor array are simultaneously transferred to respective first floating diffusion layers 154, where they are temporarily stored. Global transfer transistor 152 is turned on by a global transfer signal to transfer electrical charges accumulated at respective photodiode regions 150 to respective first floating diffusion layers 154. Global transfer signal is simultaneously provided to all global transfer transistors 152 in the pixel sensor array.

Pixel transfer transistor 156 is turned on by a pixel selection signal to transfer the electrical charges accumulated in first floating diffusion layer 154 to second floating diffusion layer 158. Second floating diffusion layer 158 performs the same function as the floating diffusion layer of the conventional 4-transistor pixel sensor. A gate voltage of source follower transistor 164 varies according to the amount of electrical charges accumulated in second floating diffusion layer 158. Accordingly, a voltage of a data output terminal Vout corresponding to a source of the source follower transistor 164 is changed.

Electrical charges simultaneously accumulated at all photodiode regions 150 of the image sensor are temporarily stored in respective first floating diffusion layers 154 before respective corresponding pixel selection signals are applied thereto. Where a pixel selection signal is applied to pixel transfer transistor 165, electrical charges are transferred to second floating diffusion layer 158 to output data.

The pixel sensor further comprises a retention gate 166 formed on first floating diffusion layer 154. Retention gate 166 is formed on first floating diffusion layer 154 to protect first floating diffusion layer 154 and to improve functions of the pixel sensor such as transferring, injecting, and maintaining the electrical charges.

When the electrical charges are transferred to first floating diffusion layer 154, a signal with an opposite polarity to the electrical charges or ground is applied to retention gate 166 in order to reduce the electrical potential of first floating diffusion layer 154.

When the electrical charges accumulated in first floating diffusion layer 154 are transferred to second floating diffusion layer 58, a signal having the same polarity as the electrical charges is applied to retention gate 166 in order to increase the electrical potential of first floating diffusion layer 154.

The electrical charges can be effectively maintained in first floating diffusion layer 154 before they are transferred to second floating diffusion layer 158 by applying a voltage having an opposite polarity of the electrical charges to retention gate 166.

In the pixel sensor shown in FIG. 3A, reset transistor 160 is connected to photodiode region 150, unlike the pixel sensor shown in FIG. 2A. Connecting reset transistor 160 to photodiode region 150 prevents electrical charges accumulated in photodiode region 150 from overflowing in cases where the time between frames in a SFCM is prolonged. In the embodiment shown in FIG. 2A, the overflow of charges in photodiode region 150 can be removed by increasing a reset time. However, in the embodiment shown in FIG. 3A, the overflow can be prevented by connecting reset transistor 160 to photodiode region 150.

After the electrical charges accumulated in photodiode region 150 are transferred to first floating diffusion layer 154, global transfer transistor 152 is turned off. While the pixel sensor waits for a pixel selection signal, power supply voltage VDD is supplied to photodiode region 150 by turning on reset transistor 160. Accordingly, until a next frame is captured after a current frame is captured, the amount of electrical charges accumulated in photodiode region 150 is reset, so that an overflow phenomenon does not occur. Furthermore, even where dark current occurs in a pixel sensor, it can be removed by reset transistor 160 connected to photodiode region 150.

After data is output from the pixel sensor, global transfer transistor 152 and pixel transfer transistor 156 are turned on together with reset transistor 160, thereby resetting a voltage of photodiode region 150 first and second floating diffusion layers 154 and 158 to power source voltage VDD.

Figure 3B:
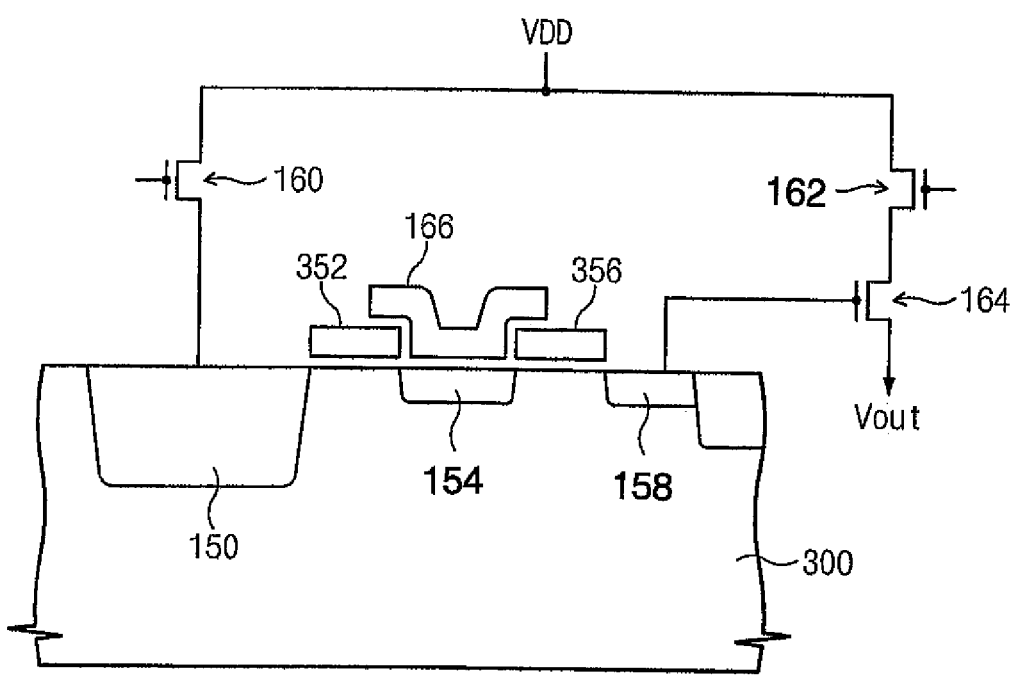
FIG. 3B is a diagram showing a cross-sectional view of part of the CMOS image sensor in FIG. 3A; and, FIG. 3C is a timing diagram demonstrating the operation of the CMOS image sensor shown in FIG. 3A.

FIG. 3B is a diagram showing a cross-sectional view of part of the pixel sensor in FIG. 3A.

Referring to FIG. 3B, the pixel sensor comprises global transfer transistor 152, which is serially connected between pixel transfer transistor 156 and photodiode region 150. Reset transistor 160 is connected to photodiode region 150. As shown in FIG. 3B, photodiode region 150, first floating diffusion layer 154, and second floating diffusion layer 158 are formed on a semiconductor substrate 300. A gate electrode 352 of a global transfer transistor defining a channel region between photodiode region 150 and first floating diffusion layer 154 is formed on semiconductor substrate 300. A gate electrode 356 of pixel transfer transistor 156 defining a channel region between the first and second floating diffusion layers 154 and 158 is formed on semiconductor substrate 300. Retention gate 166 is formed on first floating diffusion layer 154. Retention gate 166 covers an upper portion of first floating diffusion layer 154 to prevent damage from occurring in first floating diffusion layer 154 due to manufacturing processes. In addition, retention gate 154 performs a function of light from hitting first floating diffusion layer 154. Retention gate 166 is electrically insulated from gates formed at both sides thereof.

FIG. 3C is a timing diagram illustrating the operation of the pixel sensor shown in FIG. 3A.

Referring to FIG. 3C, in a reset step (□), global transfer signal Tg is input to global transfer transistor 152 with logic level "high", a pixel selection signal Tp is input to pixel transfer transistor 156 with logic level "high", a signal Gd is input to retention gate 166 with logic level "low", and a reset signal Reset is set to a logic level "high" to reset the electrical potential of photodiode region 150 and first and second floating diffusion layers 154 and 158 to power source voltage VDD. At this time, a signal Vout output from data output terminal Vout is set to a reference voltage level.

In an image sensing step (□), signals Tg, Tp, and Reset are switched to logic level "low". Then, electrical charges are generated by incident light in photodiode region 150.

In a frame capture step (□), global transfer signal Tg assumes logic level "high" to transfer electrical charges accumulated in photodiode region 150 to first floating diffusion layer 154. While the electrical charges are transferred to first floating diffusion layer 154, signal Gd is switched to logic level "high" in order to maintain the electrical charges thereat.

In a pixel selection waiting step (□), signal Gd is maintained at logic level "high" in order to retain the electrical charges in first floating diffusion layer 154 until pixel transfer transistor 156 is turned on. In addition, reset signal Reset is switched to logic level "high" to reset the amount of electrical charges accumulated in photodiode region 150. Reset signal Reset is maintained at logic level "high" until a reset step of a next frame.

In a data output step (□), pixel selection signal Tp is switched to logic level "high" in order to transfer electrical charges accumulated at first floating diffusion layer 154 to second floating diffusion layer 158. The voltage level of data output terminal Vout changes according to the amount of electrical charges accumulated in second floating diffusion layer 158. An image signal is outputted by a difference between a current level of signal Vout and a reference level Vs of signal Vout.

As previously mentioned, it is possible to create a CMOS image sensor with a single frame capture mode by forming a first floating diffusion layer for temporarily storing electrical charges between a second floating diffusion layer for changing a gate voltage of a source follower transistor and a photodiode region.

Moreover, loss of electrical charges can be prevented after an image is captured by forming a retention gate on the first floating diffusion layer in which electrical charges are temporarily stored. The transferring and storing capability of the electrical charges can be improved by applying a voltage to a retention gate while transferring and storing the electrical charges.

Furthermore, it is possible to prevent overflow of electrical charges in the photodiode region during a time between frames in a single capture mode by connecting a reset transistor to a photodiode.

The foregoing preferred embodiments are teaching examples. Those of ordinary skill in the art will understand that various changes in form and details may be made to the exemplary embodiments without departing from the scope of the present invention which is defined by the following claims.

What is claimed:

1. An image sensor comprising a plurality of pixel sensors, wherein each pixel sensor comprises:
    a photodiode region adapted to generate electrical charges in response to incident light thereon;
    a global transfer transistor connected between the photodiode region and a first floating diffusion layer and having a gate adapted to receive a global transfer signal;
    a pixel transfer transistor connected between the first floating diffusion layer and a second floating diffusion layer and having a gate adapted to receive a pixel selection signal;
    a reset transistor connected between a power supply and the photodiode region and having a gate adapted to receive a reset signal; and,
    a source follower transistor connected between the power supply and a data output terminal and having a gate connected to the second floating diffusion layer.

2. The image sensor of claim 1, wherein each pixel sensor further comprises:
    a retention gate formed on an upper portion of the first floating diffusion layer.

3. The image sensor of claim 2, wherein a voltage with an opposite polarity from the electrical charges or a ground voltage is applied to the retention gate in order to transfer the electrical charges from the photodiode region to the first floating diffusion layer.

4. The image sensor of claim 2, wherein a voltage with the same polarity as the electrical charges is applied to the retention gate in order to transfer the electrical charges from the first floating diffusion layer to the second floating diffusion layer.

5. The image sensor of claim 1, wherein the reset transistor is turned on between a time when the global transfer transistor is turned off and a time when the global transfer transistor is reset in order to reset an amount of electrical charges in the photodiode region.

6. The image sensor of claim 5, wherein the global transfer transistor and the pixel transfer transistor are turned on after data is output from the image sensor in order to reset an amount of electrical charges in the first and second floating diffusion layers.

7. The image sensor of claim 1, wherein each of the plurality of pixel sensors is adapted to receive the global transfer signal simultaneously.

8. The image sensor of claim 1, wherein electrical charges accumulated in respective photodiode regions of the plurality of pixel sensors are simultaneously transferred to respective first floating diffusion layers in response to the global transfer signal; and,
    wherein data produced by the plurality of pixel sensors is sequentially output from the image sensor in response to the pixel selection signal.

* * * * *